(12) United States Patent
Lee

(10) Patent No.: US 8,487,525 B2
(45) Date of Patent: Jul. 16, 2013

(54) LIGHT EMITTING DEVICE INCLUDING OPTICAL LENS

(75) Inventor: Chung Hoon Lee, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 615 days.

(21) Appl. No.: 12/598,891

(22) PCT Filed: May 2, 2008

(86) PCT No.: PCT/KR2008/002512
§ 371 (c)(1),
(2), (4) Date: Feb. 4, 2010

(87) PCT Pub. No.: WO2008/136619
PCT Pub. Date: Nov. 13, 2008

(65) Prior Publication Data
US 2010/0141109 A1    Jun. 10, 2010

(30) Foreign Application Priority Data

May 4, 2007   (KR) .................. 10-2007-0043799

(51) Int. Cl.
*H01J 1/62* (2006.01)
(52) U.S. Cl.
USPC .......................... 313/501; 313/512
(58) Field of Classification Search
USPC .............................. 313/498–512
See application file for complete search history.

(56) References Cited

U.S. PATENT DOCUMENTS

| | | | |
|---|---|---|---|
| 2006/0071593 A1* | 4/2006 | Tan et al. | 313/512 |
| 2006/0164003 A1* | 7/2006 | Chan et al. | 313/498 |
| 2007/0063201 A1* | 3/2007 | Kuo | 257/79 |
| 2007/0132366 A1* | 6/2007 | Yabe et al. | 313/501 |

FOREIGN PATENT DOCUMENTS

| | | |
|---|---|---|
| JP | 2007035885 | 2/2007 |
| KR | 1020060033438 | 4/2006 |
| WO | 2006093015 | 9/2006 |
| WO | 2007023807 | 3/2007 |

* cited by examiner

*Primary Examiner* — Joseph L Williams
(74) *Attorney, Agent, or Firm* — H.C. Park & Associates, PLC (57) ABSTRACT

According to the present invention, there is provided a light emitting device that includes at least one laser diode configured to emit light in at least one first wavelength region selected from spectrum regions including ultraviolet light, blue light, and green light; and a light emitting material for emitting light in a second wavelength region by the light emitted from the laser diode, the second wavelength region being different from the first wavelength region. A color-mixed light is made by the light in the first wavelength region and the light in the second wavelength region. Since the laser diode is used as a light emission source, the color-mixed light implemented by the light emitting device has high linearity, so that it may be effectively used for long-distance illumination and flash.

18 Claims, 9 Drawing Sheets

Figure 17

LIGHT EMITTING DEVICE INCLUDING OPTICAL LENS

CROSS-REFERENCE TO RELATED APPLICATIONS

This application is the National Stage of International Application No. PCT/KR2008/002512, filed May 2, 2008, and claims priority from and the benefit of Korean Patent Application No. 10-2007-0043799, filed on May 4, 2007, which are both hereby incorporated by reference for all purposes as if fully set forth herein.

FIELD OF THE INVENTION

The present invention relates to a light emitting device, and more specifically, to a light emitting device capable of emitting light having strong straightness, in which a laser diode having strong straightness is used as a light source and a light emitting material uses light having a first wavelength emitted from the laser diode to emit light having a second wavelength, thereby implementing a color-mixed light.

DISCUSSION OF THE BACKGROUND

A light emitting diode (LED) that is a representative light emitting device is a device for emitting a predetermined light through recombination of minority carriers (electrons or holes) as a compound semiconductor having p-n junction structure. The light emitting diode has characteristics of low power consumption, long lifespan, installation in a narrow space, and strong resistance against vibration. In recent years, a white light emitting diode in addition to a single color light emitting diode, e.g. a red, blue or green light emitting diode, has been placed on the market, and its demands have been rapidly increased.

The light emitting diode may implement white light by using a light emitting material which functions as a wavelength converting means. That is, the light emitting material is applied to an upper portion of a light emitting diode, so that a portion of primary light emitted from the light emitting diode and secondary light whose wavelength has been converted by the light emitting material are color-mixed to implement white color. The white light emitting diode configured as described above has been prevalently used since it is lower in price and very simple in principle and structure.

For example, applied to a light emitting diode for emitting blue light is a light emitting material that causes yellowish green or yellow light to be emitted using a portion of the blue light as an excitation source, so that white light can be obtained by color-mixing the blue light emitted from the light emitting diode and the yellowish green or yellow light emitted from the light emitting material.

However, since the light emitting diode has a wide emission angle of a light source and poor straightness, the light emitting diode has currently been used only for short-distance illumination and has a limitation in being used for long-distance illumination and flasher. As such, a light emitting device having strong straightness enough to be used for long-distance illumination and flash has been prevalently required.

SUMMARY OF THE INVENTION

The present invention is conceived to solve the aforementioned problems in the prior art. An object of the present invention is to provide a light emitting device having strong straightness enough to be used for long-distance illumination and flash.

According to an aspect of the present invention for achieving the objects, there is provided a light emitting device, which comprises at least one laser diode configured to emit light in at least one first wavelength region selected from spectrum regions including ultraviolet ray, blue light and green light; and a light emitting material for emitting light in a second wavelength region by the light in the first wavelength region emitted from the laser diode, the second wavelength region being different from the first wavelength region, wherein a color-mixed light is made by the light in the first wavelength region and the light in the second wavelength region.

The light emitting material may include a compound containing copper as a host lattice component.

The light emitting material may be a compound represented as the following Chemical Formula:

$$a(M^{I}O) \cdot b(M^{II}O) \cdot c(M^{III}A) \cdot d(M^{III}_2O) \cdot e(M^{IV}_2O_3) \cdot f(M^{V}_oO_p) \cdot g(SiO_2) \cdot h(M^{VI}_xO_y)$$

where $M^{I}$ comprises at least one element selected from the group consisting of Pb and Cu; $M^{II}$ comprises at least one element selected from the group consisting of Be, Mg, Ca, Sr, Ba, Zn, Cd and Mn; $M^{III}$ comprises at least one element selected from the group consisting of Li, Na, K, Rb, Cs, Au and Ag; $M^{IV}$ comprises at least one element selected from the group consisting of Al, Ga and In; $M^{V}$ comprises at least one element selected from the group consisting of Ge, V, Nd, Ta, W, Mo, Ti, Zr and Hf; $M^{VI}$ comprises at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A comprises at least one element selected from the group consisting of F, Cl, Br and I; and a, b, c, d, e, f, g, h, o, p, x and y are set in ranges of $0 \leq a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$, and $1 \leq y \leq 5$ respectively.

Preferably, the light emitting material may be a compound represented as the following Chemical Formula:

$$((Br,Sr,Ca)_{1-x}(Pb,Cu)_x)_2SiO_4:Eu,B$$

where B comprises at least one element selected from the group consisting of Bi, Sn, Sb, Sc, Y, La, Ce, Pr, Nd, Pm, Sm, Gd, Tb, Dy, Ho, Er, Tm, Yb and Lu; x is set in a range of 0 to 1; and Eu and B are set in ranges of 0 to 0.2.

The light emitting material may be a compound represented as the following Chemical Formula:

$$(A_{1-x-y}Eu_xM^{I}_y)(B_{2-y}M^{II}_y)S_4$$

where A comprises at least one element selected from the group consisting of Ba, Sr and Ca; B comprises at least one element selected from the group consisting of Al, Ga and In; $M^{I}$ is at least one rare-earth element selected from the group consisting of Sc, La, Gd and Lu; $M^{II}$ comprises at least one element selected from the group consisting of Mg, Zn and Be; and x and y are set in ranges of $0.005 < x < 0.9$, $0 < y < 0.995$ and $x + y < 1$.

The light emitting material may be a compound represented as the following Chemical Formula:

$$(A_{1-x-y}Eu_x(M^{I}_{0.5}M^{II}_{0.5})_y)B_2S_4$$

where A comprises at least one element selected from the group consisting of Ba, Sr and Ca; B comprises at least one element selected from the group consisting of Al, Ga and In; $M^{I}$ is at least one rare-earth element selected from the group consisting of Sc, La, Gd and Lu; $M^{II}$ comprises at least one element selected from the group consisting of Li, Na and K; and, x and y are set in ranges of 0.005<x<0.9, 0<y<0.995 and x+y<1.

The light emitting material may be a compound represented as the following Chemical Formula:

$$M^I_a M^{II}_b M^{III}_c O_d$$

where $M^I$ comprises at least Ce and comprises at least one element selected from the group consisting of Cr, Mn, Fe, Co, Ni, Cu, Pr, Nd, Sm, Eu, Dy, Ho, Er, Tm and Tb; $M^{II}$ comprises at least one element selected from the group consisting of Mg, Ca, Zn, Sr, Cd and Ba; $M^{III}$ comprises at least one element selected from the group consisting of Al, Sc, Ga, Y, In, La and Lu; and a, b, c and d are set in ranges of $0.0001 \leq a \leq 0.2$, $0.8 \leq b \leq 1.2$, $1.6 \leq c \leq 2.4$ and $3.2 \leq d \leq 4.8$.

The light emitting material may be a compound represented as the following Chemical Formula:

$$(Sr_{1-u-v-x}Mg_uCa_vBa_x)(Ga_{2-y-z}Al_yIn_z S_4):Eu^{2+}$$

where u, v, x, y and z are set in ranges of $0 \leq u \leq 1$, $0 \leq v \leq 1$, $0 \leq x \leq 1$, $0 < (u+v+x) \leq 1$, $0 \leq y \leq 2$, $0 \leq z \leq 2$ and $0 \leq y+z \leq 2$.

The light emitting material may be a compound represented as the following Chemical Formula:

$$(2-x-y)SrO \cdot x(Ba_u Ca_v)O \cdot (1-a-b-c-d)SiO_2 \cdot aP_2O_6 \cdot bAl_2O_3 \cdot cB_2O_3 \cdot dGeO_2 : yEu^{2+}$$

where x, y, a, b, c, d, u and v are set in ranges of $0 \leq x < 1.6$, $0.005 < y < 0.5$, $x+y \leq 1.6$, $0 \leq a < 0.5$, $0 \leq b < 0.5$, $0 \leq c < 0.5$, $0 \leq d < 0.5$ and $u+v=1$.

The light emitting material may be a compound represented as the following Chemical Formula:

$$(2-x-y)BaO \cdot x(Sr_u Ca_v)O \cdot (1-a-b-c-d)SiO_2 \cdot aP_2O_6 \cdot bAl_2O_3 \cdot cB_2O_3 \cdot dGeO_2 : yEu^{2+}$$

where x, y, u and v are set in ranges of $0.01 < x < 1.6$, $0.005 < y < 0.5$, $u+v=1$ and $x \cdot u \geq 0.4$; and at least one of a, b, c and d is larger than 0.01.

The light emitting material may be a compound represented as the following Chemical Formula:

$$M_x Si_y N_z : Eu$$

where M comprises at least one element selected from the group consisting of Ca, Sr and Ba; and $z = \frac{2}{3}x + \frac{4}{3}y$.

Preferably, x=2 and y=5, or x=1 and y=7.

The light emitting material may be a compound represented as the following Chemical Formula:

$$MAlSiN_3 : Eu$$

where M comprises at least one element selected from the group consisting of Ca, Sr, Ba and Mg.

The light emitting material may be a compound represented as the following Chemical Formula:

$$MSiN_2 : Eu$$

where M comprises at least one element selected from the group consisting of Ca, Sr, Ba and Mg.

The light emitting material may be a compound represented as the following Chemical Formula:

$$Me_x Si_{12-(m+n)} Al_{(m+n)} O_n N_{16-n} : Re1_y Re2_z$$

where Me comprises at least one element selected from the group consisting of Ca, Mg and Y; Re1 comprises at least one element selected from the group consisting of Ce, Pr, Eu, Tb and Yb; and Re2 is Dy.

The light emitting material may be a compound represented as the following Chemical Formula:

$$(Ca,Sr)_{1-x-y} Eu_x Pb_y S$$

where x is set in a range of 0.0005 to 0.01; and y is set in a range of 0 to 0.5.

In addition to the aforementioned compounds, the light emitting device may include at least one selected from the group consisting of sulfide, nitride, oxynitride, thiogallate, silicate, orthosilicate, and garnet.

The light emitting device may further comprise a body for mounting the laser diode thereon; and a molding portion for encapsulating the laser diode on the body, wherein the light emitting material is mixed and distributed in the molding portion. The body may be any one of a substrate, a heat sink and a lead terminal.

The light emitting device may further comprise an optical lens positioned over the laser diode and mounted on the substrate, wherein the optical lens has the light emitting material contained therein.

The light emitting material may be distributed in the optical lens, or applied to or deposited on a lower or upper surface of the optical lens.

The substrate may be formed with a recessed region, wherein the laser diode is mounted in the recessed region.

The light emitting device may further comprise a member for coupling the optical lens with the substrate.

The optical lens may have an optical pattern formed on an upper portion thereof, and the light emitting material may be formed within a recessed region, which is formed in a lower portion of the optical lens, or on a lower surface of the optical lens.

The optical lens may have an optical pattern formed on a lower portion thereof, and the light emitting material may be formed within a recessed region, which is formed in an upper portion of the optical lens, or on an upper surface of the optical lens.

The optical lens may have optical patterns formed on upper and lower portions thereof, and the light emitting material may be formed inside of the optical lens.

The optical lens may have the optical pattern formed on the lower portion thereof, the light emitting material may be formed within the upper portion of the optical lens, and the upper optical pattern made of transparent resin may be formed on the light emitting material.

The light emitting material may comprise light emitting materials for emitting lights having wavelengths different from each other laminated as layers different from each other.

A light emission wavelength of the light emitted from the light emitting material layer adjacent to the laser diode may be longer than that from another light emitting material layer positioned thereover.

According to the present invention so constructed, a laser diode having strong straightness is used as a light source and a light emitting material uses light having a first wavelength emitted from the laser diode to emit light having a second wavelength, so that a color-mixed light can be implemented.

Since the laser diode is used as a light source, the color-mixed light implemented by the light emitting device of the present invention has strong straightness, so that it can be effectively used for long-distance illumination and flash.

DETAILED DESCRIPTION OF THE ILLUSTRATED EMBODIMENTS

Hereinafter, a light emitting device according to the present invention will be described in detail with reference to the accompanying drawings. However, the present invention is not limited to the embodiments set forth herein but can be implemented in various forms different from each other. Rather, the embodiments are merely provided to allow the present invention to be completely described herein and to fully convey the scope of the invention to those skilled in the art.

Figure 1:
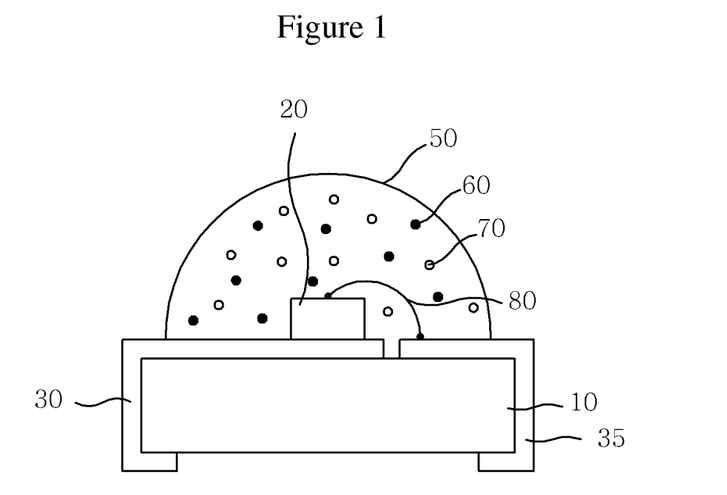
FIG. 1 is a sectional view showing a chip type light emitting device according to an embodiment of the present invention.

FIG. 1 is a sectional view showing a chip type light emitting device according to an embodiment of the present invention.

Referring to FIG. 1, the light emitting device comprises a substrate 10, first and second electrodes 30 and 35 formed on the substrate 10, a laser diode 20 mounted on the first electrode 30, and a molding portion 50 for encapsulating the laser diode 20. Light emitting materials 60 and 70 are uniformly mixed and distributed in the molding portion 50.

The substrate 10 may be formed with a predetermined recess in its central region on which the laser diode 20 is mounted, wherein the recess may be formed in such a manner that a sidewall surface thereof is inclined at a predetermined slope. At this time, the laser diode 20 is mounted on a lower surface of the recess, and the sidewall surface of the recess with the predetermined slope allows the light emitted from the laser diode 20 to be maximally reflected, so that its luminous efficiency can be increased.

The electrodes 30 and 35 are configured to be the first and second electrodes 30 and 35, which are formed on the substrate 10 and connected to anode and cathode terminals of the laser diode 20, respectively. The first and second electrodes 30 and 35 may be formed by a printing technique. The first and second electrodes 30 and 35 are made of a metallic material such as copper or aluminum with excellent conductivity and configured to be electrically disconnected from each other.

The laser diode 20 is a GaN-, InGaN-, AlGaN- or AlGaInN-based laser diode for emitting blue light. In this embodiment, a laser diode for emitting blue light in a range of 420 to 480 nm is used. However, the laser diode 20 is not limited thereto but may be configured to emit light having one or more wavelength regions selected from spectrum regions including ultraviolet ray, blue light and green light. For example, the laser diode 20 may include a laser diode for emitting ultraviolet ray in a range of 250 to 410 nm as well as a laser diode for emitting blue light. Further, only one laser diode may be used as the laser diode 20, or a plurality of laser diodes may be configured depending on the purpose thereof.

The laser diode 20 is mounted on the first electrode 30 and electrically connected to the second electrode 35 through a wire 80. Alternatively, if the laser diode 20 is mounted on neither the first electrode 30 nor the second electrode 35 but formed on the substrate 10, the laser diode 20 may be connected to the first and second electrodes 30 and 35 through two wires 80, respectively.

Further, the molding portion 50 for encapsulating the laser diode 20 is formed over the substrate 10. As described above, the light emitting materials 60 and 70 are uniformly mixed and distributed in the molding portion 50.

The molding portion 50 may be formed through an injection process using a mixture of a predetermined transparent epoxy resin and the light emitting materials 60 and 70. Alternatively, the molding portion 50 may be formed in such a manner that it is first formed using a separate mold and then pressurized or heat treated. The molding portion 50 may be formed into various shapes such as an optical lens shape, a flat plate shape, and a shape in which a predetermined concavo-convex portion is formed on its surface.

In such a light emitting device according to the present invention, primary light is emitted from the laser diode 20, and then, the primary light allows each light emitting material 60 or 70 to emit secondary light having a converted wavelength, so that color in a desired spectrum region can be implemented through the color-mixing of the primary and secondary lights. For example, blue light is emitted from a blue light laser diode and causes the light emitting materials 60 and 70 to emit light with at least one selected from green, yellow and red spectrum regions. Thus, the primary light, i.e., a portion of the blue light is color-mixed with the secondary light, i.e., the light with at least one selected from the green, the yellow and the red spectrum regions, thereby implementing color-mixed light. Accordingly, the light emitting device of the present invention can implement the color-mixed light with a continuous spectrum ranged from green to red, so that its color rendering and straightness can be improved. The color-mixed light includes, e.g., white light which has been currently spotlighted.

Various wavelength converting materials for emitting light having a secondary wavelength by the light having a primary wavelength emitted from the laser diode 20 may be used as the light emitting materials 60 and 70.

The light emitting materials 60 and 70 may be selected from the group consisting of sulfide, nitride, oxynitride, thiogallate, silicate, orthosilicate, and garnet.

For example, the light emitting materials 60 and 70 may include a compound containing Cu as a host lattice component.

Among them, a silicate based light emitting material has the structure that is represented as the following Chemical Formula 1:

$a(M^IO) \cdot b(M^{II}O) \cdot c(M^{III}A) \cdot d(M^{III}_2O) \cdot e(M^{IV}_2O_3) \cdot f(M^V_2O_p) \cdot g(SiO_2) \cdot h(M^{VI}_xO_y)$      [Chemical Formula 1]

In Chemical Formula 1, $M^I$ comprises at least one element selected from the group consisting of Pb and Cu; $M^{II}$ comprises at least one element selected from the group consisting of Be, Mg, Ca, Sr, Ba, Zn, Cd and Mn; $M^{III}$ comprises at least one element selected from the group consisting of Li, Na, K, Rb, Cs, Au and Ag; $M^{IV}$ comprises at least one element selected from the group consisting of Al, Ga and In; $M^V$ comprises at least one element selected from the group consisting of Ge, V, Nd, Ta, W, Mo, Ti, Zr and Hf; $M^{VI}$ comprises at least one element selected from the group consisting of Bi, Sn, Sb, Sc, Y, La, Ce, Pr, Nd, Pm, Sm, Eu, Gd, Tb, Dy, Ho, Er, Tm, Yb and Lu; and A comprises at least one element selected from the group consisting of F, Cl, Br and I.

Further, in Chemical Formula 1, a, b, c, d, e, f, g, h, o, p, x and y are set in ranges of $0 \leq a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$ and $1 \leq y \leq 5$, respectively.

Preferably, the silicate based light emitting material may be an orthosilicate based compound which may be represented as the following Chemical Formula 2:

$$((Br,Sr,Ca)_{1-x}(Pb,Cu)_x)_2SiO_4:Eu,B \quad \text{[Chemical Formula 2]}$$

In Chemical Formula 2, B comprises at least one element selected from the group consisting of Bi, Sn, Sb, Sc, Y, La, Ce, Pr, Nd, Pm, Sm, Gd, Tb, Dy, Ho, Er, Tm, Yb and Lu. Further, x is set in a range of 0 to 1; and Eu and B are set in a range of 0 to 0.2.

A thiogallate light emitting material has the structure that is represented as the following Chemical Formula 3:

$$(A_{1-x-y}Eu_xM^I_y)(B_{2-y}M^{II}_y)S_4 \quad \text{[Chemical Formula 3]}$$

In Chemical Formula 3, A comprises at least one element selected from the group consisting of Ba, Sr and Ca; B comprises at least one element selected from the group consisting of Al, Ga and In; $M^I$ is at least one rare-earth element selected from the group consisting of Sc, La, Gd and Lu; and $M^{II}$ comprises at least one element selected from the group consisting of Mg, Zn and Be. Further, in Chemical Formula 3, x and y are set in ranges of $0.005 < x < 0.9$, $0 < y < 0.995$ and $x+y<1$.

Further, the thiogallate light emitting material has the structure that is represented as the following Chemical Formula 4:

$$(A_{1-x-y}Eu_x(M^I_{0.5}M^{II}_{0.5})_y)B_2S_4 \quad \text{[Chemical Formula 4]}$$

In Chemical Formula 4, A comprises at least one element selected from the group consisting of Ba, Sr and Ca; B comprises at least one element selected from the group consisting of Al, Ga and In; $M^I$ is at least one rare-earth element selected from the group consisting of Sc, La, Gd and Lu; and $M^{II}$ comprises at least one element selected from the group consisting of Li, Na and K. Further, in Chemical Formula 4, x and y are set in ranges of $0.005 < x < 0.9$, $0 < y < 0.995$ and $x+y<1$.

The silicate or thiogallate light emitting material is excited by receiving blue light thereby to implement green light whose property is very excellent.

Further, the garnet light emitting material has the structure that is represented as the following Chemical Formula 5:

$$(Re_{1-r}Sm_r)_3(Al_{1-s}Ga_s)_6O_{12}:Ce \quad \text{[Chemical Formula 5]}$$

In Chemical Formula 5, Re comprises at least one element selected from the group consisting of Y and Gd. Further, in Chemical Formula 5, r and s are set in ranges of $0 \leq r < 1$ and $0 \leq s \leq 1$.

Further, the garnet based light emitting material has the structure that is represented as the following Chemical Formula 6:

$$(A_3B_6O_{12}):Ce \quad \text{[Chemical Formula 6]}$$

In Chemical Formula 6, A comprises at least one element selected from the group consisting of Y, Lu, Se, La, Gd and Tb, in which Tb serves as a host crystal component; and B comprises at least one element selected from the group consisting of Al, Ga and In.

Preferably, the garnet based light emitting material has the structure that is represented as the following Chemical Formulas 7 and 8:

$$Y_3(Al,Ga)_6O_{12}:Ce \quad \text{[Chemical Formula 7]}$$

$$(Tb_{1-x-y}SE_xCe_y)_3(Al,Ga)_6O_{12} \quad \text{[Chemical Formula 8]}$$

where SE comprises at least one element selected from the group consisting of Y, Gd and Lu; and $0 \leq x \leq 0.5-y$ and $0 < y < 0.1$.

Further, the light emitting material has the structure that is represented as the following Chemical Formula 9:

$$M^I_aM^{II}_bM^{III}_cO_d \quad \text{[Chemical Formula 9]}$$

In Chemical Formula 9, $M^I$ comprises at least Ce and comprises at least one element selected from the group consisting of Cr, Mn, Fe, Co, Ni, Cu, Pr, Nd, Sm, Eu, Dy, Ho, Er, Tm and Tb; $M^{II}$ comprises at least one element selected from the group consisting of Mg, Ca, Zn, Sr, Cd and Ba; and $M^{III}$ comprises at least one element selected from the group consisting of Al, Sc, Ga, Y, In, La, and Lu. Further, in Chemical Formula 9, a, b, c and d are set in ranges of $0.0001 \leq a \leq 0.2$, $0.8 \leq b \leq 1.2$, $1.6 \leq c \leq 2.4$ and $3.2 \leq d \leq 4.8$.

Further, the light emitting material has the structure that is represented as the following Chemical Formula 10:

$$(Sr_{1-u-v-x}Mg_uCa_vBa_x)(Ga_{2-y-z}Al_yIn_zS_4):Eu^{2+} \quad \text{[Chemical Formula 10]}$$

In Chemical Formula 10, u, v, x, y and z are set in ranges of $0 \leq u \leq 1$, $0 \leq v \leq 1$, $0 \leq x \leq 1$, $0 \leq (u+v+x) \leq 1$, $0 \leq y \leq 2$, $0 \leq z \leq 2$ and $0 \leq y+z \leq 2$.

Further, the light emitting material has the structure that is represented as the following Chemical Formula 11:

$$(2-x-y)SrO \cdot x(Ba_u,Ca_v)O \cdot (1-a-b-c-d)$$
$$SiO_2 \cdot aP_2O_6 bAl_2O_3 cB_2O_3 dGeO_2:yEu^{2+} \quad \text{[Chemical Formula 11]}$$

In Chemical Formula 11, x, y, a, b, c, d, u and v are set in ranges of $0 \leq x < 1.6$, $0.005 < y < 0.5$, $x+y \leq 1.6$, $0 \leq a < 0.5$, $0 \leq b < 0.5$, $0 \leq c < 0.5$, $0 \leq d < 0.5$ and $u+v=1$.

Further, the light emitting material has the structure that is represented as the following Chemical Formula 12:

$$(2-x-y)BaO \cdot x(Sr_u,Ca_v)O \cdot (1-a-b-c-d)$$
$$SiO_2 \cdot aP_2O_6 bAl_2O_3 cB_2O_3 dGeO_2:yEu^{2+} \quad \text{[Chemical Formula 12]}$$

In Chemical Formula 12, x, y, u and v are set in ranges of $0.01 < x < 1.6$, $0.005 < x < 0.5$, $u+v=1$ and $x \cdot u \geq 0.4$; and at least one of a, b, c and d is larger than 0.01.

The nitride based light emitting material has the structure that is represented as the following Chemical Formula 13:

$$M_xSi_yN_z:Eu \quad \text{[Chemical Formula 13]}$$

Here, M comprises at least one element selected from the group consisting of Ca, Sr and Ba; and z is characterized by $z=\frac{2}{3}x+\frac{4}{3}y$. Preferably, x and y are characterized by $x=2$ and $y=5$, or $x=1$ and $y=7$.

The nitride based light emitting material has the structure that is represented as the following Chemical Formula 14:

$$MAlSiN_3:Eu \quad \text{[Chemical Formula 14]}$$

Here, M is characterized by comprising at least one element selected from the group consisting of Ca, Sr, Ba and Mg.

The nitride based light emitting material has the structure that is represented as the following Chemical Formula 15:

$$MSiN_2:Eu \quad \text{[Chemical Formula 15]}$$

Here, M is characterized by comprising at least one element selected from the group consisting of Ca, Sr, Ba and Mg.

The nitride based light emitting material has the structure that is represented as the following Chemical Formula 16:

$$Me_xSi_{12-(m+n)}Al_{(m+n)}O_nN_{16-n}:Re1_yRe2_z \quad \text{[Chemical Formula 16]}$$

Here, Me comprises at least one element selected from the group consisting of Ca, Mg and Y; Re1 comprises at least one element selected from the group consisting of Ce, Pr, Eu, Tb and Yb; and Re2 is Dy.

The alkaline earth metal sulfide based light emitting material has the structure that is represented as the following Chemical Formula 17:

$$(Ca,Sr)_{1-x-y}Eu_xPb_yS \qquad \text{[Chemical Formula 17]}$$

Here, x is set in a range of 0.0005 to 0.01; and y is set in a range of 0 to 0.5.

Very excellent green, yellow and red lights may be implemented under the excitation of light with the blue region by using the aforementioned light emitting materials according to the present invention. Further, since the laser diode having strong straightness is used as a light emission source, the straightness of the implemented color-mixed light can be improved.

Figure 2:
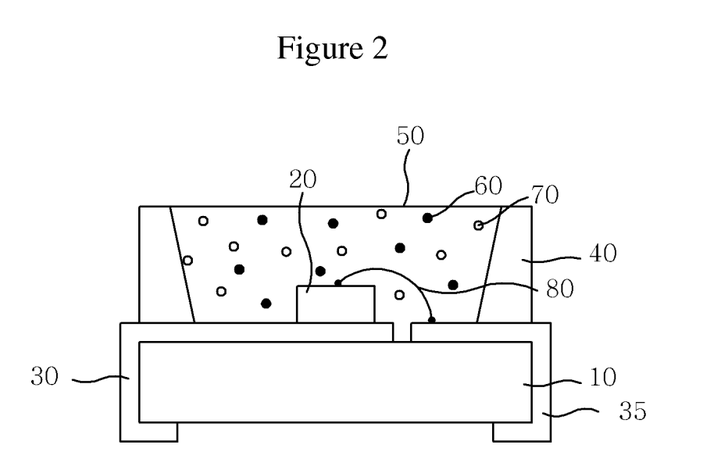
FIG. 2 is a sectional view showing a top view light emitting device according to another embodiment of the present invention.

FIG. 2 is a sectional view showing a top view light emitting device according to another embodiment of the present invention.

Referring to this figure, the light emitting device comprises a substrate 10, first and second electrodes 30 and 35 formed on the substrate 10, and a laser diode 20 mounted on the first electrode 30. Such a configuration is almost identical with that of the aforementioned chip type light emitting device, and accordingly, detailed descriptions thereof will be replaced with the descriptions in connection with FIG. 1. However, the top view light emitting device comprises a reflector 40 formed on the substrate 10 to encompass the laser diode 20, and a molding portion 50 filled in a central hole of the reflector 40 for protecting the laser diode 20.

In order to improve brightness and light collecting capability, an inner sidewall of the reflector 40 which encompasses the laser diode may be formed to have a predetermined inclination. Such a configuration is preferable to maximize the reflection of light emitted from the laser diode 20 and to improve the luminous efficiency.

The light emitting materials 60 and 70 as described above are uniformly mixed and distributed in the molding portion 50. Accordingly, the primary light emitted from the laser diode 20 is color-mixed with the secondary light having a wavelength converted by each light emitting material 60 or 70, thereby implementing the color in a desired spectrum range.

Figure 3:
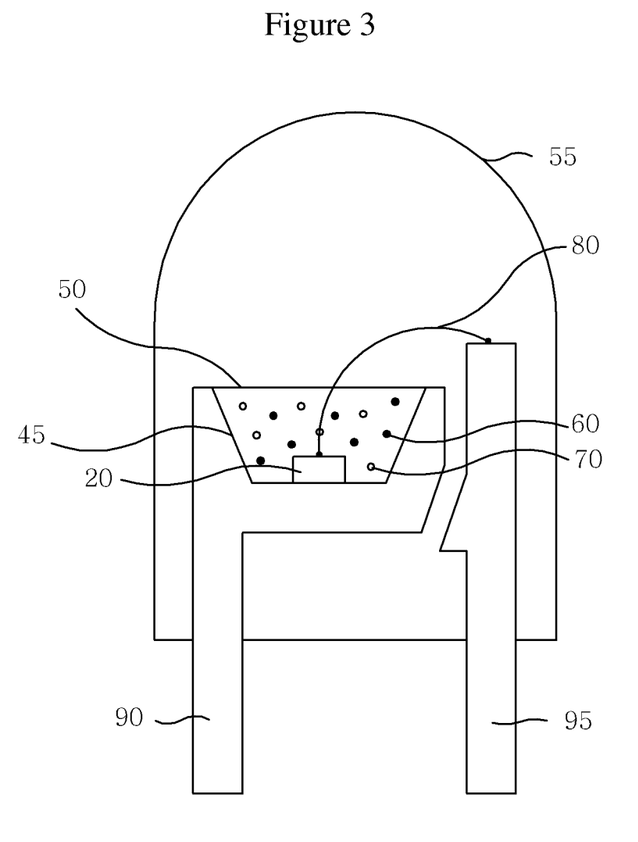
FIG. 3 is a sectional view showing a lamp type light emitting device according to a further embodiment of the present invention.

FIG. 3 is a sectional view showing a lamp type light emitting device according to a further embodiment of the present invention.

Referring to this figure, the light emitting device comprises a first lead terminal 90 having a reflecting portion 45 formed therein, and a second lead terminal 95 spaced apart from the first lead terminal 90 by a predetermined interval. A laser diode 20 is mounted in the reflecting portion 45 of the first lead terminal 90 and electrically connected to the second lead terminal 95 through a wire 80. A molding portion 50 containing the light emitting materials 60 and 70 are formed over the laser diode 20. An outer peripheral molding portion 55 formed through a mold is provided around front ends of the first and second lead terminals 90 and 95. The light emitting materials 60 and 70, which absorb light emitted from the laser diode 20 to convert the wavelength of the absorbed light into respective wavelengths, are uniformly distributed in the molding portion 50. The outer peripheral molding portion 55 is made of a transparent epoxy resin to improve the transmittance of the light emitted from the laser diode 20.

Figure 4:
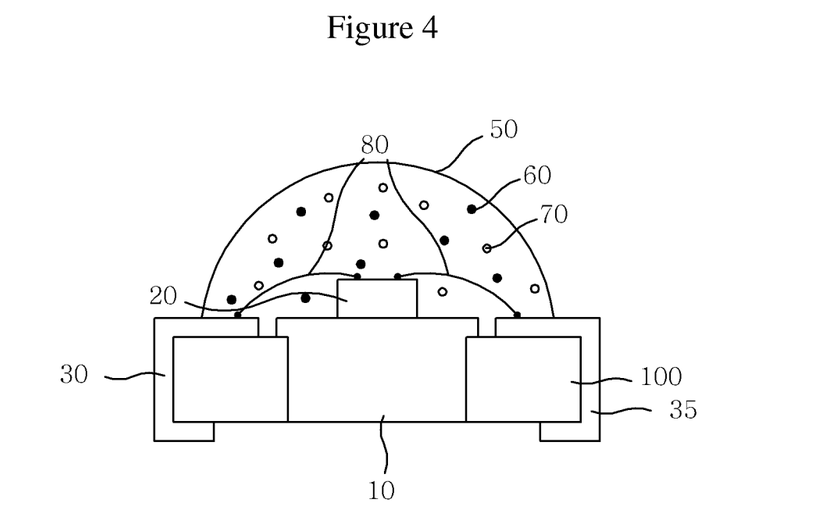
FIG. 4 is a sectional view showing a light emitting device including a housing according to a still further embodiment of the present invention.

FIG. 4 is a sectional view showing a light emitting device including a housing according to a still further embodiment of the present invention.

Referring to this figure, the light emitting device comprises a housing 100 having first and second electrodes 30 and 35 formed on both sides thereof and a through hole provided therethrough, a substrate 10 mounted in the through hole of the housing 100, and a laser diode 20 mounted on the substrate 10. At this time, the substrate 10 may be formed of a material with excellent thermal conductivity to function as a heat sink, so that heat dissipated from the laser diode 20 can be more effectively dissipated. The light emitting device further includes a molding portion 50 for encapsulating the laser diode 20. Further, the light emitting materials 60 and 70 as described above are uniformly mixed and distributed in the molding portion 50.

The electrodes 30 and 35 are composed of the first and second electrodes 30 and 35 which are formed on the substrate 10 and connected to positive and negative terminals of the laser diode 20, respectively. The laser diode 20 is mounted on the substrate 10 and electrically connected to the first electrode 30 and the second electrode 35 through the wires 80.

Figure 5:
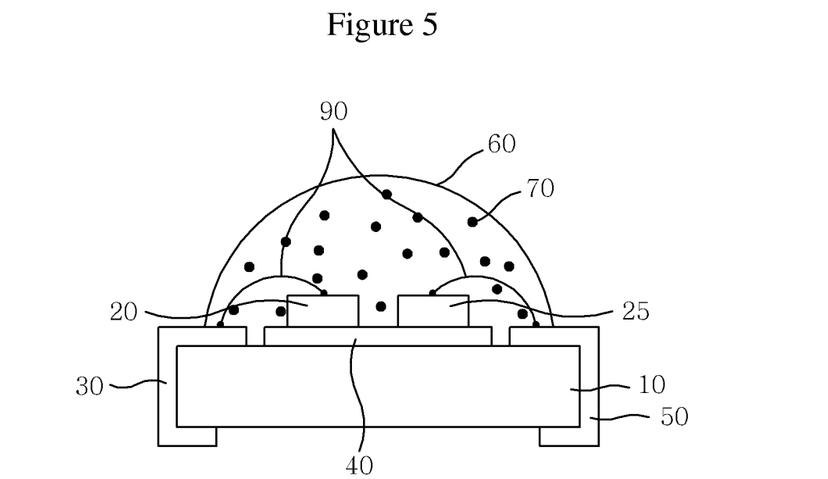
FIGS. 5 to 17 are sectional views showing light emitting devices according to other embodiments of the present invention.

FIG. 5 is a sectional view showing a light emitting device according to a still further embodiment of the present invention.

Referring to this figure, the light emitting device comprises a substrate 10, first, second and third electrodes 30, 40 and 50 formed on the substrate 10, and laser diodes 20 and 25 for emitting blue light and red light, respectively. A molding portion 60 for encapsulating the laser diodes 20 and 25 is provided on the substrate 10, and the light emitting material 70 as described above is contained in the molding portion 60.

The substrate 10 may include a reflecting portion (not shown) formed in such a manner that a predetermined recess is formed in a central region of the substrate 10 by mechanical processing and a sidewall of the recess is configured to have a predetermined inclination. By forming such a reflecting portion, the reflection of light emitted from the laser diodes 20 and 25 can be maximized and the luminous efficiency can be increased.

The electrodes 30, 40 and 50 of this embodiment are composed of the first, second and third electrodes 30, 40 and 50 provided on the substrate 10, and may be formed by a printing technique or using an additive.

The blue and red laser diodes 20 and 25, which have positive and negative electrodes on upper and lower surfaces thereof, respectively, are commonly mounted on the second electrode 40 and electrically connected to the first and third electrodes 30 and 50 through the respective wires 90, so that the respective laser diodes 20 and 25 can be simultaneously or independently operated.

The shape and the number of the electrodes 30, 40 and 50 or the mounting technique of the laser diodes 20 and 25 related thereto is not limited to the aforementioned descriptions but may be configured in a various manner. For example, blue and red laser diodes, which have the positive and the negative electrodes on the upper surfaces thereof, may be mounted.

Further, the molding portion 60 for encapsulating the laser diodes 20 and 25 are formed on the substrate 10. The light emitting material 70, which uses the blue light emitted from the laser diodes 20 and 25 as an excitation source to emit green light, is contained in the molding portion 60. As described above, the silicate or the thiogallate based light emitting material or the garnet based light emitting material may be used as the light emitting material 70, and it is preferable that the light emitting material 70 be uniformly distributed within the molding portion 60 as illustrated in this figure. However, the present invention is not limited thereto, but the molding portion 60 may be formed after a mixture of the light emitting material 70 and a resin is dotted to a predetermined thickness so as to encompass both the upper and the side surfaces of the blue laser diode 20.

Due to the light emitting material 70, which is uniformly distributed within the molding portion 60 according to this embodiment, the light emitted from the blue and red laser diodes 20 and 25 can be uniformly color-mixed to implement a more uniformly color-mixed light.

The molding portion 60 may be formed by an injection process using a mixture of a predetermined epoxy resin and the light emitting material 70. Alternatively, the molding portion 60 may be formed by being first manufactured using an additional mold then being pressurized or heat-treated. The molding portion 60 may be formed in various shapes such as an optical lens shape, a plate shape and a shape in which a predetermined concavo-convex portion is formed on its surface.

In such a light emitting device according to the present invention, primary lights are emitted from the respective blue and red laser diodes 20 and 25, and then a portion of the primary lights allows the light emitting material 70 to emit secondary light with a converted wavelength, so that color in a desired spectrum region can be implemented through the color-mixing of the primary and secondary lights. That is, blue and red lights are emitted from the blue and red laser diodes 20 and 25, respectively, and a portion of the blue light causes the light emitting material 70 to emit green light. As such, the primary lights, i.e., the portion of the blue light and the red light, and the secondary light, i.e., the green light, may be color-mixed to implement the color-mixed light.

Figure 6:
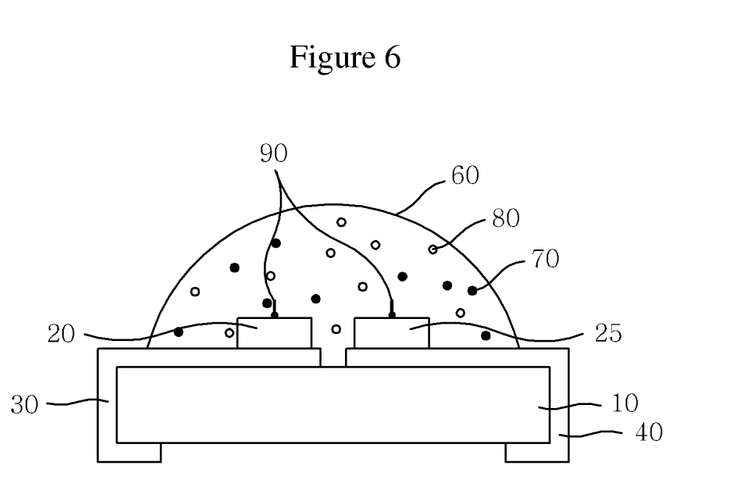

FIG. 6 is a sectional view showing a light emitting device according to a still further embodiment of the present invention.

Referring to FIG. 6, the light emitting device comprises a substrate 10, first and second electrodes 30 and 40 formed on the substrate 10, and laser diodes 20 and 25 for emitting blue and red lights, respectively. A molding portion 60 for encapsulating the laser diodes 20 and 25 are provided on the substrate 10, and the aforementioned light emitting material 70 and a scattering material 80 are contained in the molding portion 60. Such a configuration is almost identical with that described in FIG. 5, and accordingly, the detailed descriptions overlapping therewith will be omitted.

The electrodes 30 and 40 of this embodiment are composed of the first electrode 30, the second electrode 40 and the third electrode (not shown), and then, the laser diodes 20 and 25 are mounted on the first and second electrodes 30 and 40, respectively, and commonly and electrically connected to the third electrode (not shown) through wires 90. Alternatively, the first, second, third and fourth electrodes may be provided, and then, the laser diodes 20 and 25 are respectively mounted on the first and second electrodes 30 and 40, and independently electrically connected to the respective third and fourth electrodes (not shown) through wires 90.

Further, the molding portion 60 for encapsulating the laser diodes 20 and 25 are formed on the substrate 10. The molding portion 60 includes therein the light emitting material 70 and the scattering material 80 uniformly distributed therein. A light emitting material, which uses the blue light as the excitation source to emit the green light as described above, may be used as the light emitting material 70. Further, the scattering material 80 is added to make the color-mixing of light more smooth and includes particles having a size of 0.1 to 20 μm. At least one of $SiO_2$, $Al_2O_3$, $TiO_2$, $Y_2O_3$, $CaCO_3$ and MgO is used as the scattering material 80.

Since the light emitting device including the scattering material 80 as described above allows the light emitted from the laser diodes 20 and 25 to be scattered and the scattered light to be emitted, the light can be uniformly emitted over a wide region without forming any unnecessary light emitting pattern. Accordingly, the light which has wavelengths different from each other are emitted over a wide region and more uniformly mixed, so that the light emitting device can be used to implement the uniformly color-mixed light.

Figure 7:
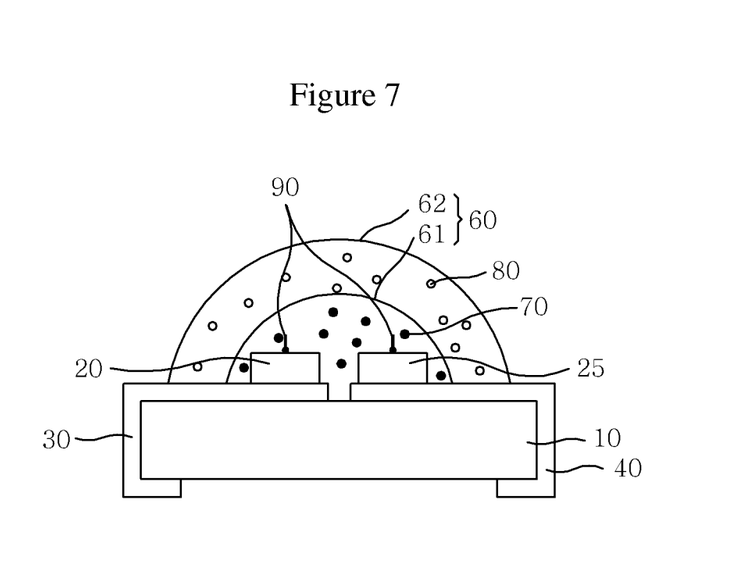

FIG. 7 is a sectional view showing a light emitting device according to a still further embodiment of the present invention.

Referring to FIG. 7, the light emitting device comprises a substrate 10, electrodes 30 and 40 formed on the substrate 10, and laser diodes 20 and 25 for respectively emitting blue and red lights. Such a configuration is almost identical with that shown in FIG. 6, and accordingly, the detailed descriptions overlapping therewith will be omitted. However, the light emitting device comprises a first molding portion 61 for encapsulating the laser diodes 20 and 25 on the substrate 10 and having a light emitting material 70 uniformly distributed therein and a second molding portion 62 for encompassing the first molding portion 61 and having a scattering material 80 uniformly distributed therein.

Blue light and red light are emitted from the blue and red laser diodes 20 and 25, respectively, and pass through the first molding portion 61, and a portion of the blue light causes the light emitting material 70 to emit green light. Accordingly, the portion of the blue light, the red light and the green light with a converted wavelength are color-mixed to implement the color-mixed light. At this time, the scattering material 80 distributed in the second molding portion 62 causes the lights whose wavelengths are different from each other to be more uniformly mixed, and accordingly, the light emitting device can implement the uniformly color-mixed light.

Although the first molding portion 61 including the light emitting material 70 therein is configured to encapsulate the blue and red laser diodes 20 and 25 in this figure, the present invention is not limited thereto. The first molding portion 61 may be first formed to encapsulate the blue laser diode 20, and then, the second molding portion 62 having the scattering material 80 uniformly distributed therein may be formed to encompass the first molding portion 61 and the red laser diode 25.

Figure 8:
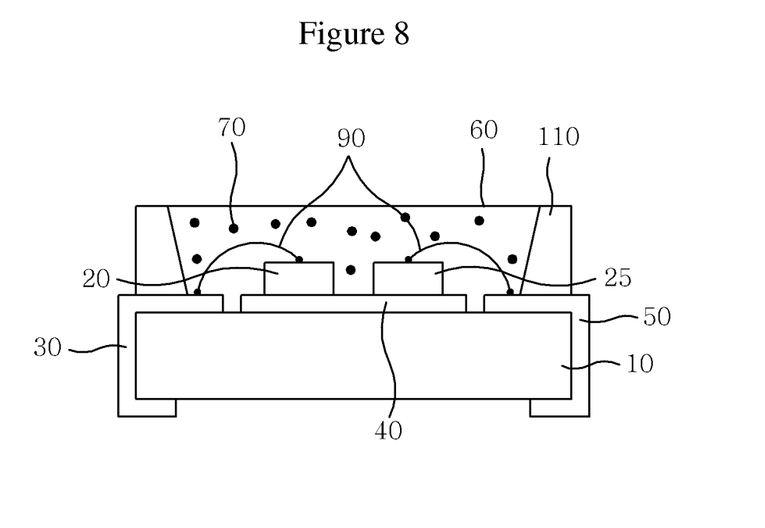

FIG. 8 is a sectional view showing a light emitting device according to a still further embodiment of the present invention.

Referring to FIG. 8, the light emitting device comprises a substrate 10, electrodes 30, 40 and 50 formed on the substrate 10, and laser diodes 20 and 25 for respectively emitting blue and red lights. Such a configuration is almost identical with that of the first embodiment, and accordingly, the detailed descriptions thereof will be replaced with those in connection with FIG. 1. However, this embodiment comprises a reflector 110 formed on the substrate 10 to encompass the laser diodes 20 and 25, and a molding portion 60 filled in a central hole of the reflector 110 in order to encapsulate the laser diodes 20 and 25. The molding portion 60 has a light emitting material 70 uniformly distributed therein.

In order to improve brightness and light collecting capability, an inner sidewall of the reflector 110 which encompasses the laser diodes 20 and 25 may be formed to have a predetermined inclination. Such a configuration is preferable to maximize the reflection of the light emitted from the laser diodes 20 and 25 and to improve the luminous efficiency.

Figure 9:
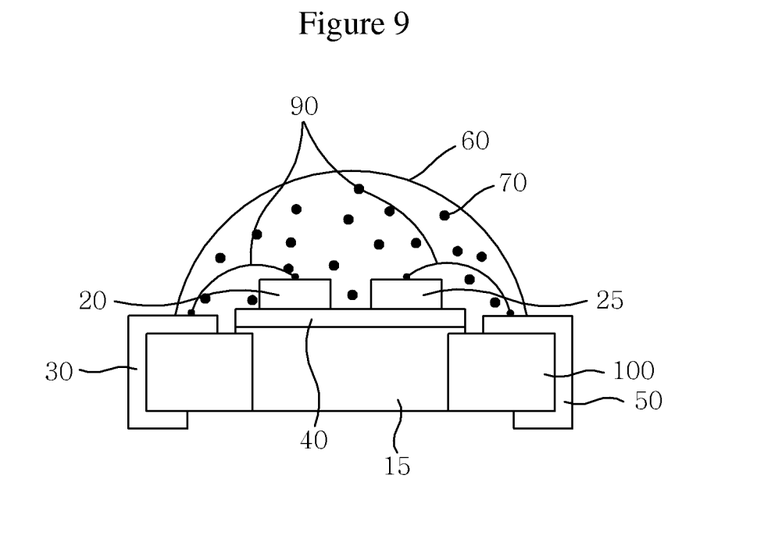

FIG. 9 is a sectional view showing a light emitting device according to a still further embodiment of the present invention.

Referring to FIG. 9, the light emitting device comprises a housing 100 having first and third electrodes 30 and 50 formed on both sides thereof and a through hole provided therethrough, a substrate 15 mounted in the through hole of the housing 100, and blue and red laser diodes 20 and 25 commonly mounted on a second electrode 40 formed on the substrate 10. At this time, the substrate 10 may be formed of a certain material with excellent thermal conductivity to function as a heat sink, so that heat dissipated from the laser diodes 20 and 25 can be more effectively discharged. In addition, there is further included a molding portion 60 for encapsulating the laser diodes 20 and 25, and the aforementioned light emitting material is uniformly mixed and distributed in the molding portion 60. The detailed descriptions of this embodiment overlapping with the embodiments shown in FIGS. 5 to 8 will be omitted.

Figure 10:
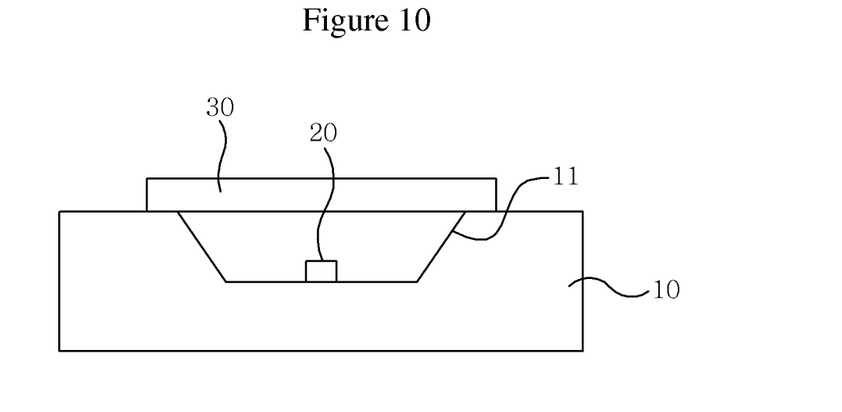

FIG. 10 is a sectional view showing a light emitting device according to a still further embodiment of the present invention.

Referring to FIG. 10, the light emitting device comprises a substrate 10, a laser diode 20 mounted on a recessed region formed in the substrate 10, and an optical lens 30 for covering an upper portion of the substrate 10 having the recessed region.

At this time, the substrate 10 has a recessed region formed therein, and a recessed surface 11 in the recessed region may be formed with a reflecting material. The substrate 10 may be formed of a material with excellent thermal conductivity to function as a heat sink, so that heat dissipated from the laser diode 20 may be more effectively discharged. Further, the optical lens 30 includes the aforementioned light emitting material. The optical lens 30 may be provided with the light emitting material through various methods. For example, the light emitting material may be uniformly distributed in the optical lens 30, or may be applied to or deposited on an upper or a lower surface of the optical lens 30.

Figure 11:
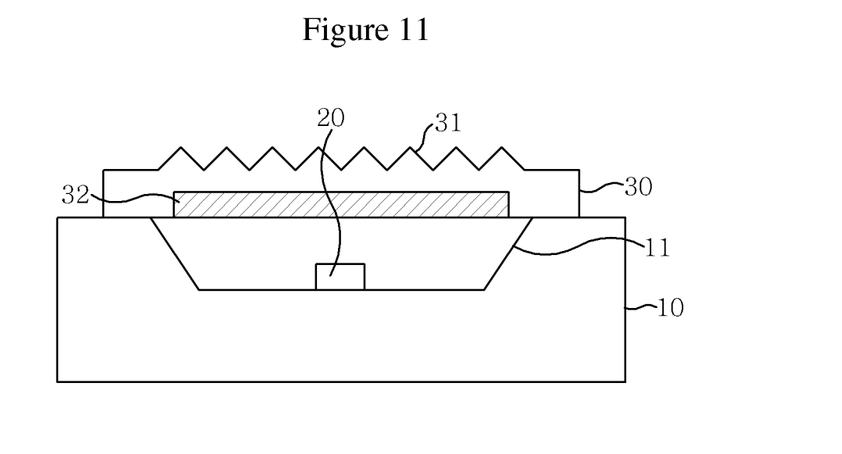
Figure 12:
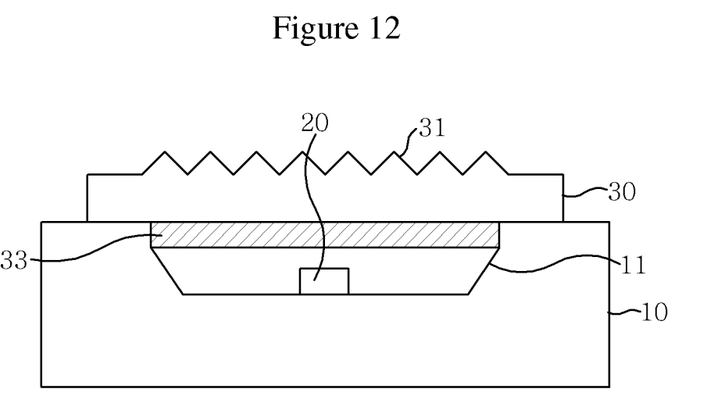
Figure 13:
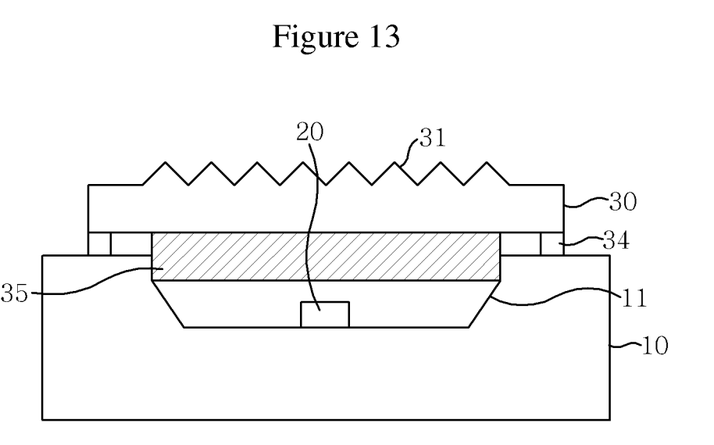

FIGS. 11 to 13 are sectional views showing light emitting devices according to still further embodiments of the present invention, respectively.

Referring to FIGS. 11 to 13, the light emitting device comprises a substrate 10, a laser diode 20 mounted on a recessed region formed in the substrate 10, and an optical lens 30 for covering an upper portion of the substrate 10 having the recessed region. An optical pattern 31 is formed on an upper portion of the optical lens 30. Further, the aforementioned light emitting material is formed at a lower portion of the optical lens 30. The light emitting material may be formed at the lower portion of the optical lens 30 by various methods.

For example, as shown in FIG. 11, a light emitting material 32 may be formed within the lower portion of the optical lens 30. For example, after a recessed region is formed in the lower portion of the optical lens 30, the light emitting material 32 may be formed by various methods, such as injection, deposition, application or printing of the aforementioned light emitting material. Accordingly, the light excited and emitted from the light emitting material 32 may form a desired pattern through the optical pattern 31.

Alternatively, as shown in FIG. 12, a light emitting material 33 which is composed of the aforementioned light emitting material may be formed on the lower portion of the optical lens 30, for example, by using a mask. This embodiment has an advantage when it is applied to an optical lens, such as a Fresnel lens, which requires precise positional coupling.

At this time, as shown in FIG. 13, a member 34 for coupling the substrate 10 with the optical lens 30 may be formed, and the coupling may be performed using a method such as UV hardening. Since the member 34 is formed, a light emitting material 35 can be formed to be thicker than the light emitting material 33 shown in FIG. 12.

At this time, the substrate 10 has a recessed region formed therein, and a recessed surface 11 in the recessed region may be formed with a reflecting material. The substrate 10 may be formed of a material with excellent thermal conductivity to function as a heat sink, so that heat dissipated from the laser diode 20 may be more effectively discharged.

Figure 14:
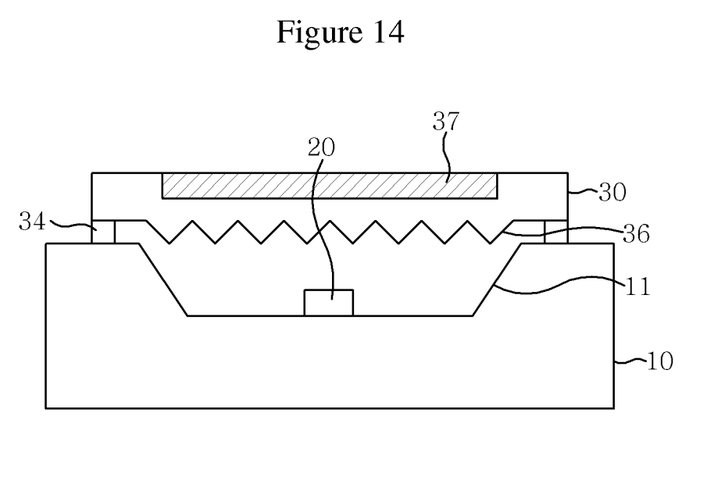

FIG. 14 is a sectional view showing a light emitting device according to another embodiment of the present invention.

Referring to FIG. 14, the light emitting device comprises a substrate 10, a laser diode 20 mounted on a recessed region formed in the substrate 10, and an optical lens 30 for covering an upper portion of the substrate 10 having the recessed region. An optical pattern 36 is formed on a lower portion of the optical lens 30. Further, the aforementioned light emitting material is formed within an upper portion of the optical lens 30. The light emitting material may be formed within the upper portion of the optical lens 30 by various methods. For example, a light emitting material 37 may be formed within the upper portion of the optical lens 30. For example, after a recessed region is formed in the upper portion of the optical lens 30, the light emitting material 37 may be formed by various methods, such as injection, deposition, application or printing of the aforementioned light emitting material.

Accordingly, the light emitted from the laser diode effectively excites the light emitting material through the optical pattern 36. Further, since the optical pattern 36 is not formed on the upper portion of the optical lens 30, the optical pattern 36 may be prevented from being broken due to scratches and the like generated when the lens is picked up or from being damaged due to foreign materials. At this time, a member 34 for coupling the substrate 10 with the optical lens 30 may be formed.

The substrate 10 has a recessed region formed therein, and a recessed surface 11 in the recessed region may be formed with a reflecting material. The substrate 10 may be formed of a material with excellent thermal conductivity to function as a heat sink, so that heat dissipated from the laser diode 20 may be more effectively discharged.

Figure 15:
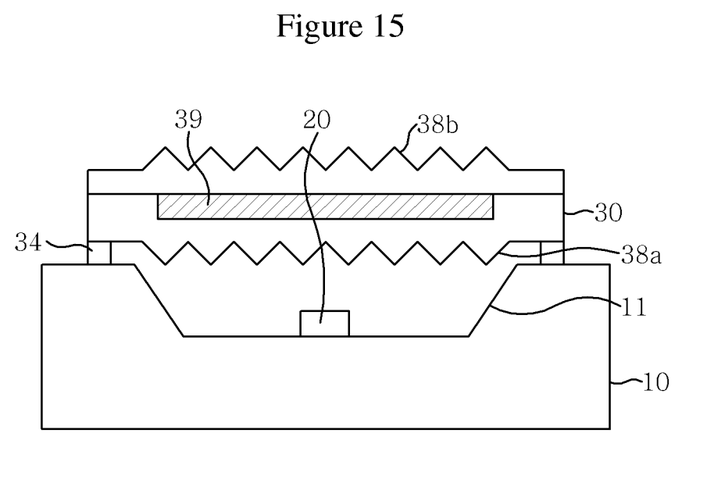

FIG. 15 is a sectional view showing a light emitting device according to a still further embodiment of the present invention.

Referring to FIG. 15, the light emitting device comprises a substrate 10, a laser diode 20 mounted on a recessed region formed in the substrate 10, and an optical lens 30 for covering an upper portion of the substrate 10 having the recessed region. Optical patterns 38a and 38b are respectively formed on upper and lower portions of the optical lens 30. Further, the aforementioned light emitting material is formed inside of the optical lens 30. The light emitting material inside of the optical lens 30 may be formed by various methods. For example, after a recessed region is formed in the optical lens 30, a light emitting material 39 may be formed by various methods, such as injection, deposition, application or printing of the aforementioned light emitting material.

To do this, after the optical pattern 38a is formed on the lower portion of the optical lens 30 and the light emitting material 39 is formed in the upper portion thereof, the optical pattern 38b is formed of a light-transparent resin on the optical lens using a mold, thereby forming desired optical patterns.

The upper and lower optical patterns may be formed integrally. To do this, after the light emitting material is formed, the upper and lower patterns may be simultaneously formed using a mold.

Further, a reflecting coating may be formed on the upper surface of the optical lens except for the upper optical pattern 38b and/or the side region thereof.

At this time, a member 34 for coupling the substrate 10 with the optical lens 30 may be formed.

The substrate 10 has a recessed region formed therein, and a recessed surface 11 in the recessed region may be formed with a reflecting material. The substrate 10 may be formed of a material with excellent thermal conductivity to function as a heat sink, so that heat dissipated from the laser diode 20 may be more effectively discharged.

In the embodiments shown in FIGS. 10 to 15, light emitting materials for emitting lights having wavelengths different from each other may be formed as layers different from each other, respectively. Further, the light emission wavelength of the light emitted from the light emitting material layer adjacent to the light source may be longer than that from another light emitting material layer positioned thereover. In addition, as the light emitting material is formed in the optical lens, the light emitting material may be spaced apart from the light source, thereby improving the thermal stability of the light emitting material. This makes it possible to prevent the optical power of the light emitting material from being deteriorated at a temperature higher than a predetermined value.

Figure 16:
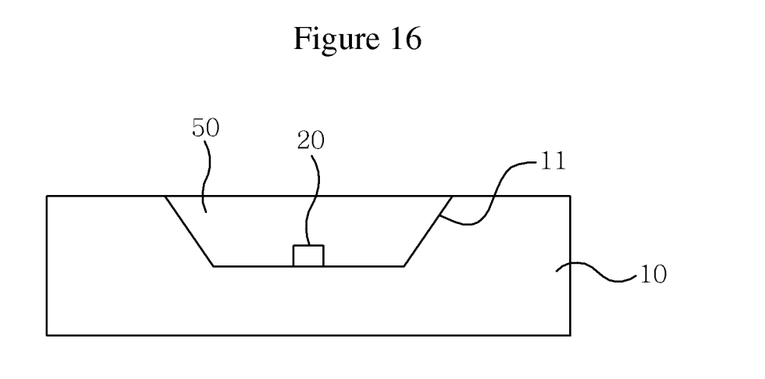

FIG. 16 is a sectional view showing a light emitting device according to a still further embodiment of the present invention.

Referring to FIG. 16, the light emitting device comprises a substrate 10, a laser diode 20 mounted on a recessed region formed in the substrate 10, and a molding portion 50 for encapsulating the laser diode 20, wherein the aforementioned light emitting material is mixed and distributed in the molding portion 50.

At this time, the substrate 10 has a recessed region formed therein, and a recessed surface 11 in the recessed region may be formed with a reflecting material. The substrate 10 may be formed of a material with excellent thermal conductivity to function as a heat sink, so that heat dissipated from the laser diode 20 may be more effectively discharged.

Figure 17:
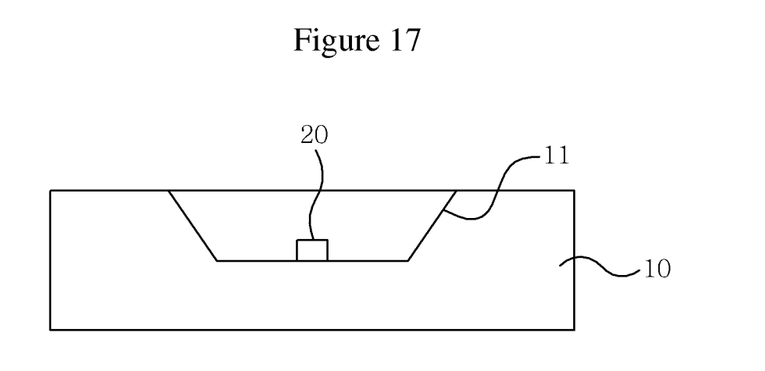

FIG. 17 is a sectional view showing a light emitting device according to a still further embodiment of the present invention.

Referring to FIG. 17, the light emitting device comprises a substrate 10, and a laser diode 20 mounted in a recessed region formed in the substrate 10, wherein the aforementioned light emitting material may be deposited on or applied to a recessed surface 11 of the substrate 10. Alternatively, a member (not shown), which the light emitting material is deposited on or applied to, may be coupled to the recessed surface 11.

At this time, the substrate 10 has a recessed region formed therein, and a recessed surface 11 in the recessed region may be formed with a reflecting material. The substrate 10 may be formed of a material with excellent thermal conductivity to function as a heat sink, so that heat dissipated from the laser diode 20 may be more effectively discharged.

As described above, the present invention may be applied to products with various structures, and the technical features of the present invention are not limited to the aforementioned embodiments but may be modified or changed in various ways.

The invention claimed is:

1. A light emitting device, comprising:
a substrate comprising a recessed region formed in an upper surface thereof;
a laser diode disposed in the recessed region and configured to emit ultraviolet light, blue light, or green light;
a first layer disposed over the laser diode and comprising a first light emitting material configured to emit light of a first wavelength when excited by the light emitted from the laser diode, and
an optical lens disposed on the substrate and configured to support the first layer,
wherein the first layer extends laterally only within the perimeter of the recessed region.

2. The light emitting device of claim 1, wherein the light emitting material comprises a compound containing copper as a host lattice component.

3. The light emitting device of claim 2, wherein the light emitting material comprises a material represented by a Chemical Formula of $$a(M^I O).b(M^{II} O).c(M^{III} A).d(M^{III}_2 O).e(M^{IV}_2 O_3).f(M^V_o O_p).g(SiO_2).h(M^{VI}_x O_y)$$

where $M^I$ comprises at least one element selected from the group consisting of Pb and Cu; $M^{II}$ comprises at least one element selected from the group consisting of Be, Mg, Ca, Sr, Ba, Zn, Cd and Mn; $M^{III}$ comprises at least one element selected from the group consisting of Li, Na, K, Rb, Cs, Au and Ag; $M^{IV}$ comprises at least one element selected from the group consisting of Al, Ga and In; $M^V$ comprises at least one element selected from the group consisting of Ge, V, Nd, Ta, W, Mo, Ti, Zr and Hf; $M^{VI}$ comprises at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A comprises at least one element selected from the group consisting of F, Cl, Br and I; and a, b, c, d, e, f, g, h, o, p, x and y are set in ranges of $0 \leq a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$ and $1 \leq y \leq 5$, respectively.

4. The light emitting device of claim 3, wherein the light emitting material comprises a material represented by a Chemical Formula of $$((Br,Sr,Ca)_{1-x},(Pb,Cu)_x)_2 SiO_4 : Eu, B$$

where B comprises at least one element selected from the group consisting of Bi, Sn, Sb, Sc, Y, La, Ce, Pr, Nd, Pm, Sm, Gd, Tb, Dy, Ho, Er, Tm, Yb and Lu; x is set in a range from 0 to 1; and Eu and B are set in a range from 0 to 0.2.

5. The light emitting device of claim 1, wherein the light emitting material comprises at least one selected from the group consisting of sulfide, nitride, oxynitride, thiogallate, silicate, orthosilicate, and garnet.

6. The light emitting device of claim 1, wherein the substrate comprises a heat sink and a lead terminal.

7. The light emitting device of claim 1, wherein the first layer is disposed on the lower or upper surface of the optical lens.

8. The light emitting device of claim 7, further comprising a second layer disposed on the first layer and comprises a second light emitting material configured to emit light of a second wavelength when excited by the light emitted from the laser diode.

9. The light emitting device of claim 8, wherein:
the optical lens comprises an optical pattern disposed on the upper surface of the optical lens; and
the first and second layers are disposed on the lower surface of the optical lens.

10. The light emitting device of claim 8, wherein:
the optical lens comprises an optical pattern disposed on the lower surface of the optical lens; and
the first and second layers are disposed on the lower surface of the optical lens.

11. The light emitting device of claim 8, wherein:
the optical lens comprises:
- a lower portion disposed on the substrate and comprising an optical pattern disposed on the lower surface thereof; and
- an upper portion disposed on the lower portion and comprising an optical pattern disposed on the upper surface thereof; and the first and second layers are disposed between the upper and lower portions of the optical lens.

12. The light emitting device of claim 11, wherein the first and second layers are disposed within a recessed region formed in the upper surface of the lower portion of the optical lens.

13. The light emitting device of claim 1, further comprising a member to couple the optical lens with the substrate.

14. The light emitting device of claim 8, wherein:
the first layer is disposed between the second layer and the laser diode; and
the first wavelength is longer than the second wavelength.

15. The light emitting device of claim 9, wherein the first and second layers are disposed within a recessed region formed in the lower surface of the optical lens.

16. The light emitting device of claim 10, wherein the first and second layers are disposed within a recessed region formed in the upper surface of the optical lens.

17. The light emitting device of claim 7, wherein the first layer is disposed on the lower surface of the optical lens and substantially covers the recessed region of the substrate.

18. The light emitting device of claim 7, wherein the first layer is disposed on the upper surface of the optical lens and substantially covers the recessed region of the substrate.

* * * * *